US006212767B1

United States Patent
Tandy

(12) United States Patent
(10) Patent No.: US 6,212,767 B1
(45) Date of Patent: Apr. 10, 2001

(54) ASSEMBLING A STACKED DIE PACKAGE

(75) Inventor: Patrick W. Tandy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/386,623

(22) Filed: Aug. 31, 1999

(51) Int. Cl.[7] .................................................. H05K 3/30
(52) U.S. Cl. .............................. 29/836; 29/832; 29/840; 257/686
(58) Field of Search ............................. 257/686; 29/832, 29/840, 836

(56) References Cited

U.S. PATENT DOCUMENTS

| 4,807,021 | * | 2/1989 | Okumura . |
| 5,422,435 | * | 6/1995 | Takiar et al. . |
| 5,495,394 | * | 2/1996 | Kornfeld et al. . |
| 5,646,828 | * | 7/1997 | Degani et al. . |
| 5,715,144 | * | 2/1998 | Ameen et al. . |

OTHER PUBLICATIONS

Proc IEEE Multi–Chip Modulke Conf Mar. 1994 Paper by D. B. Tuckerman et al pp 58–63.*
1995 Proc 45th Electronics Components & Tech Conf May 1995, Paper by G. A. Forman et al pp 664–8.*
Twenty Second IEEE/CPMT International Elctronics Manufacturing Technology Symposium Apr. 1998, Paper by F. Ahearn pp44–8.*

* cited by examiner

Primary Examiner—Carl J. Arbes
(74) Attorney, Agent, or Firm—Trop, Pruner & Hu, P.C.

(57) ABSTRACT

A technique for assembling a multi-chip module does not necessitate more than one pass through a die attach machine. The technique involves attaching a smaller die to a larger die without using a die attach machine. The larger die may be attached to a support structure using a die attach machine. In some embodiments, the larger die is affixed to the support structure first and in other embodiments, the smaller die is affixed to the larger die first.

19 Claims, 5 Drawing Sheets

ASSEMBLING A STACKED DIE PACKAGE

BACKGROUND

This invention relates generally to assembling integrated circuit dice into packages.

For a number of reasons, it may be desirable to package two dice together in a single package. For example, the components provided in a separate die may not be capable of being integrated in a single integrated circuit. For example, different process technologies may be used in each die. In addition, basic incompatibilities between components on each die may necessitate separate die fabrication. Once the dice are fabricated independently, it may be desirable to package them in a single package so that a single set of contacts may be used to connect with each of the dice.

The handling of dice, which may be stacked, to form a composite creates a number of difficulties. Predominantly, semiconductor assembly equipment is adapted to produce packages containing a single die. Thus, techniques are needed to assemble the dice.

Conventional dice assembly techniques may involve a pair of passes through a die attach machine. For example, a larger of two dice to be stacked may be attached to a support structure in a die attach machine. Thereafter, the support structure may be run through the die attach machine again to attach the smaller die to a larger die.

The repeated passes through the die attach machine may be disadvantageous for a number of different reasons. For example, the assembly process is complicated by the multiple passes through the die attach machine. In some cases the die attach process may be relatively expensive. In some cases the thermal budget may be impacted by the die attach process.

Die attach machines usually use an organic-based adhesive to attach the support structure to the die or to attach one die to another die. The adhesive may be applied in an uncured or soft phase between the surfaces to be joined. The adhesive is then cured through exposure to elevated temperatures for a specified time period. The carrier material is typically an epoxy resin or polyimide. The carrier provides the adhesion and mechanical strength along the bond line. The carrier may be filled with metal particles in the event electrical and thermal conductivity is required or with non-metallic particles such as alumina, if the ultimate bond should be an insulator.

Three types of polymer adhesives that are often used in die attach processes are epoxies, cyanate esters and polyimides. Epoxies use relatively low cure temperatures (125–175° C.) and have moderate glass transition temperatures (100–155° C.). However, epoxies vary in their ability to absorb and outgas moisture and other contaminants. Cyanate ester adhesives use higher cure temperatures (300° C.) and have relatively higher glass transition temperatures (240° C.). However, unlike epoxy adhesives, cyanate esters have low outgassing characteristics as well as low ionic contents. Finally, polyimide adhesives use high cure temperatures (greater than 400° C.) and like cyanate esters have a high glass transition temperature. A variety of conductive fillers including silver, gold or copper and non-conductive fillers, such as alumina, diamond, glass fabric, silica or ceramic may be used with the adhesive.

Thus, in addition the complexity inherent in the die attach process, in some cases the thermal exposure may be disadvantageous both to shallow junctions in advanced devices and to the wire bonds or other elements whose electrical performance may be affected.

Circuits that are susceptible to outgassing and moisture generally use a metallurgical attachment technique. Solder or metal eutectic alloys may provide good thermal conductivity but because of their electrical conductivity they may not be used if the backside of the die must be insulated from the support structure. Solders and eutectic alloys generally use higher processing temperatures and thereby impose constraints on work flow. For example, if a gold-tin die attach operation is scheduled after other chips in a multi-chip module have been wire bonded, the high temperatures used may degrade the wire bonds or degrade the electrical performance of the actual device.

Thus, for a variety of reasons, it may be desirable in making multi-chip modules, to reduce the number of times that the module or any part thereof must be exposed to the die attach process.

SUMMARY

In accordance with one aspect, a method of assembling multi-chip modules includes using a die attach machine to attach a first, relatively larger die to a support structure. A second, relatively smaller die is affixed to the larger die without using a die attach machine.

Other aspects are set forth in the accompanying detailed description and claims.

DETAILED DESCRIPTION

Figure 1:
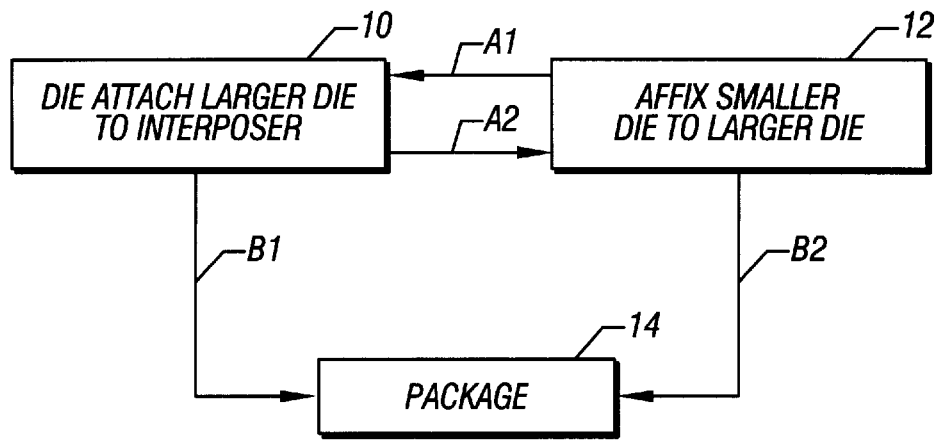
FIG. 1 is a process flow in accordance with one embodiment of the present invention.

A process for forming a multi-chip module, shown in FIG. 1, avoids the need to expose the elements of the module to a die attach machine more than one time. As used herein, a multi-chip module is intended to refer to a combination of two dice stacked one on top of the other, and coupled to a support structure. A support structure may be any one of a variety of devices used in making multi-chip modules including leadframes, substrates, and laminate cores, as examples.

The process flow may include three basic steps. One step is to die attach the larger die to the support structure (block 10). This step is conventionally done in a die attach machine. Another step is to affix a smaller die to the larger die without using a die attach machine, as illustrated by block 12. Finally, the composite of the smaller die over the larger die over a support structure may be packaged as indicated in block 14.

Two different sequences may be utilized to assemble the multi-chip module. In accordance with one sequence, the smaller die may be affixed to the larger die and then that subassembly may be die attached to a support structure as indicated by the arrows A1 in FIG. 1. Thereafter, the assembly may be packaged as indicated by arrows B1.

In accordance with another sequence, initially, the larger die may be die attached to the support structure. Thereafter, as indicated by arrow A2, the smaller die may be affixed to the larger die which has already been affixed to the support structure. Finally, as indicated by arrow B2, the assembly may be packaged.

In general, it may be advantageous, in some embodiments, if the smaller die is sufficiently smaller than the larger die to enable both dice to be wire bonded after the smaller die is attached to the larger die, with both dice facing upwardly.

Figure 2:
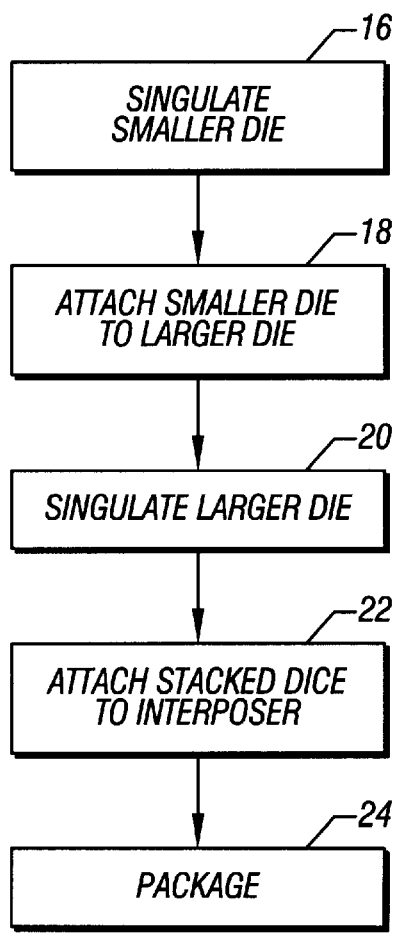
FIG. 2 is a more detailed embodiment of a process flow shown in FIG. 1.
Figure 3:
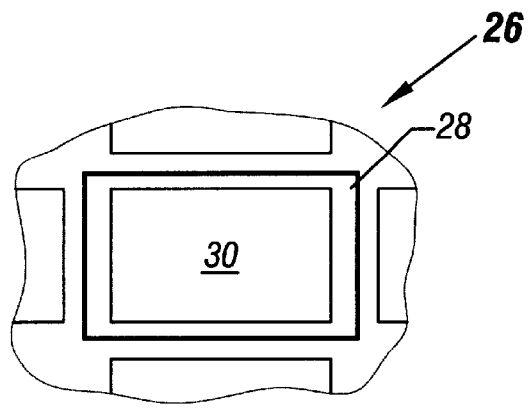
FIG. 3 is a greatly enlarged top plan view of a die positioned on a wafer.

A more detailed process, shown in FIG. 2, for implementing one of the sequences illustrated in FIG. 1, may begin by singulating a smaller die from a wafer as indicated in block 16. The smaller die may then be attached to the larger die as indicated in block 18. In accordance with one aspect of the invention, this attachment is done without using a die attach machine. Referring to FIG. 3, a semiconductor wafer 26 is shown with a smaller die 30 attached to an unsingulated, larger die 28 still in wafer form.

The smaller die 30 may be attached to the larger die 28 without using a die attach machine, but using conventional securement techniques. For example, adhesive tape such as lead on chip (LOC) tape, adhesives that do not need to be cured at temperatures above room temperature, solder or other non-die attach machine based techniques may be used.

For example, double sided die attach tape may be situated between the smaller and larger dice. A suitable tape is Sumioxy 5120T adhesive, 75 to 125 micrometers thick. Bond pads for coupling the external devices may be exposed peripherally about the larger die 28 so as to be accessible around the smaller die 30. A pick and place machine may be used to locate the smaller die over the larger die.

Figure 4:
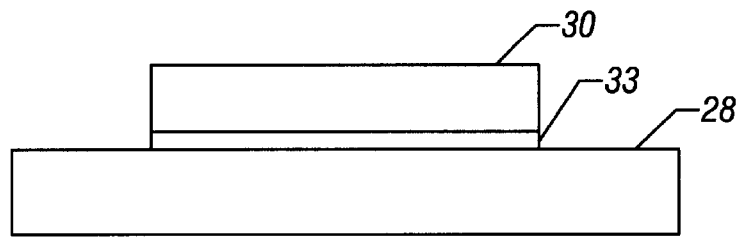
FIG. 4 is a greatly enlarged cross-sectional view of a smaller die positioned on a larger die.

Thereafter, the larger die 28 is singulated as indicated in block 20 of FIG. 2. FIG. 4 shows a cross-sectional view of the smaller die 30 attached by a securement medium 33 to the larger die 28 after the larger die has been singulated in accordance with the step illustrated by block 20.

Figure 5:
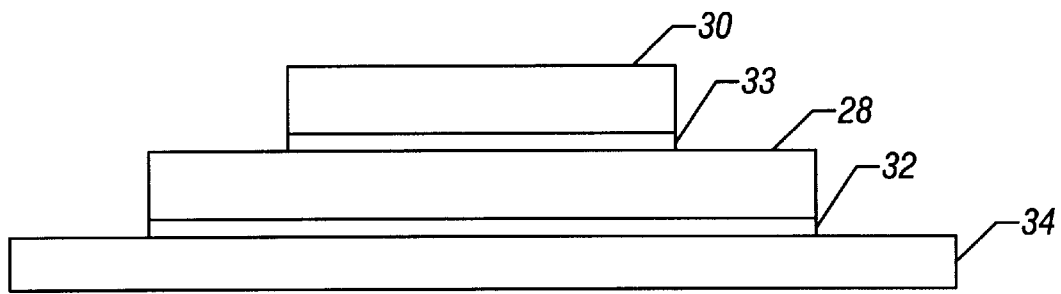
FIG. 5 is a greatly enlarged cross-sectional view of a multi-chip module.

The stack of the smaller die 30 and the larger die 28 may then be die attached to a support structure, as indicated in block 22 in FIG. 2. Similarly, FIG. 5 shows the subassembly of the smaller die 30 and larger die 28 attached to a support structure 34 through a die attach 32. The die attach 32 may be a heat curable adhesive deposited by syringe-dispensing, screen printing or stamping paste adhesive, as examples. Alternatively, perforated film adhesives may be used as the die attach. Thereafter, conventional packaging techniques may be utilized, as indicated in block 24 in FIG. 2, including encapsulation.

The die attach process may be otherwise conventional in all ways. Thus, depending on the adhesive that is utilized, the necessary time and temperature may be determined, as will be apparent to those skilled in the art. For example, a conductive adhesive may be formed as an epoxy paste with a silver filler. Its glass transition temperature is 127° C. Similarly, a nonconductive adhesive may be formed of epoxy paste with an alumina filler. Its glass transition temperature is 85° C.

Figure 6:
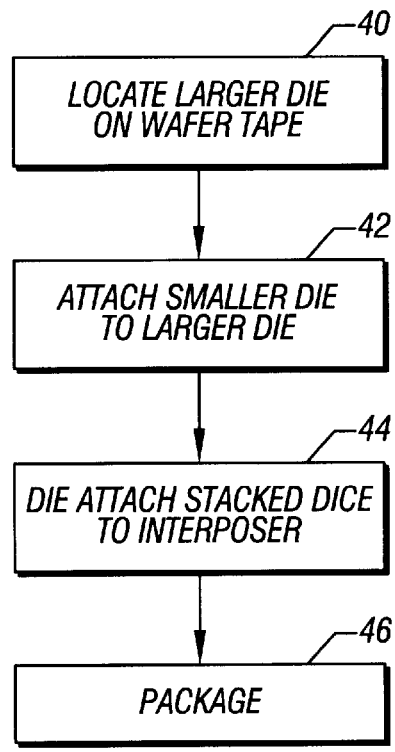
FIG. 6 is a more detailed process flow for a process in accordance with the more general flow show in FIG. 1.

In accordance with still another embodiment, a flow for assembling a multi-chip module using only one pass through a die attach machine may begin by locating a larger die on a wafer tape as illustrated at block 40 in FIG. 6. The wafer tape, sometimes called a wafer dicing tape, is a tape with high toughness used to hold wafers during the dicing process. An example of wafer tape is a polyvinyl chloride membrane with adhesive applied to one side and mounted in a frame.

Figure 7:
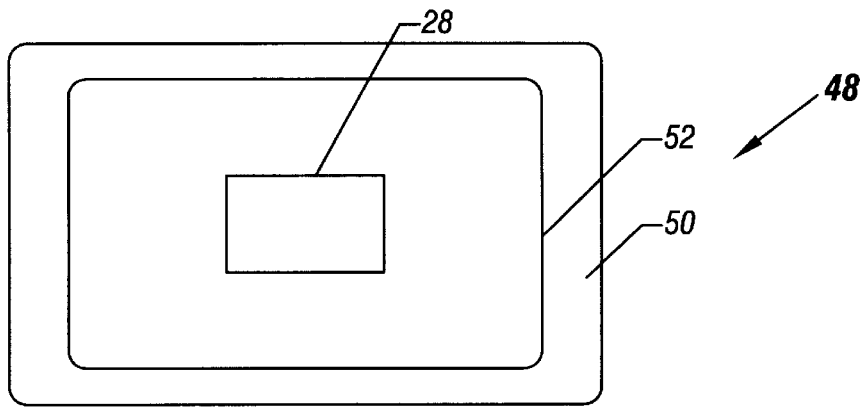
FIG. 7 is a top plan view of a die positioned on a wafer tape.

Referring to FIG. 7, the larger die 28 is shown in position on the adhesive side of a wafer tape 48. The tape 48 includes an adhesive covered polymer membrane 52 secured in a frame 50. The frame 50 is illustrated by a rectangular frame but other shapes including ring-shaped frames may be utilized as well.

The die 28 is held in position by the adhesive on the membrane 52. While only a single die is shown in position on the wafer tape 48 in FIG. 7, one or more dice may be positioned on the tape 48 at one time, in some embodiments of the present invention.

Figure 8:
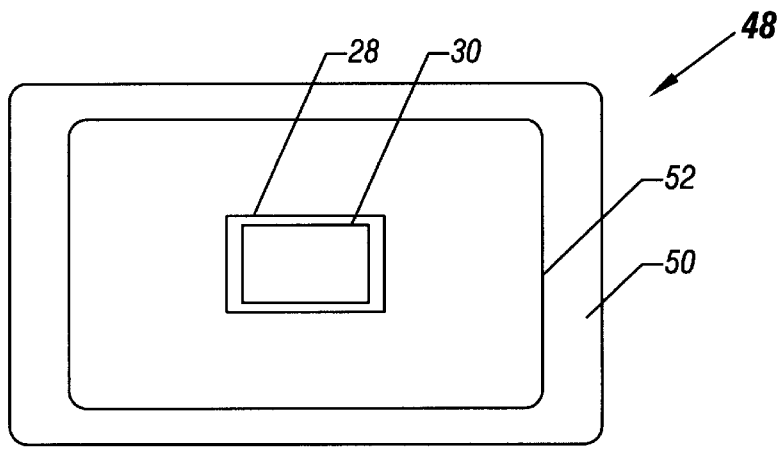
FIG. 8 is a top plan view of a smaller die positioned on a larger die positioned on a wafer tape.

Referring back to FIG. 6, the next step is to attach the smaller die to the larger die using a pick and place machine. A pick and place machine transfers the die 28 from the wafer tape 48 onto the larger die 28, as indicated in block 42. A die attach material may be positioned between the stacked die. The result, shown in FIG. 8, has a smaller die 30 on top of the larger die 28 still secured to the wafer tape 48.

Figure 12:
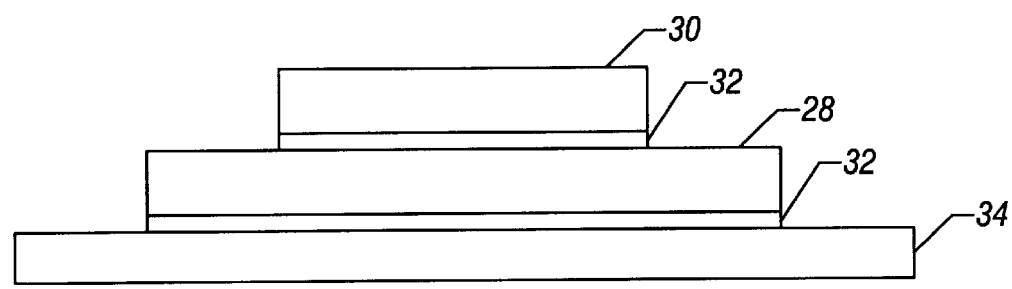
FIG. 12 is a greatly enlarged cross-sectional view of a multi-chip module.

The stacked dice are then die attached to a support structure as indicated in block 44. In the die attach machine, the die attach layers between the dice and between the layer die and the support structure may be simultaneously activated and cured. The resulting composite, shown in FIG. 12, may use die attach material as the layers 32. Thereafter, the composite is packaged as indicated in block 46 in FIG. 6.

Figure 9:
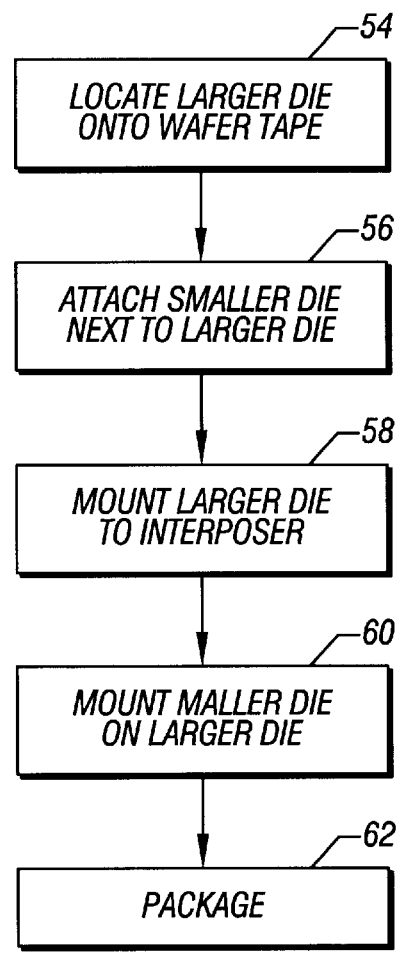
FIG. 9 is a more detailed flow for another embodiment corresponding to the more general flow shown in FIG. 1.
Figure 10:
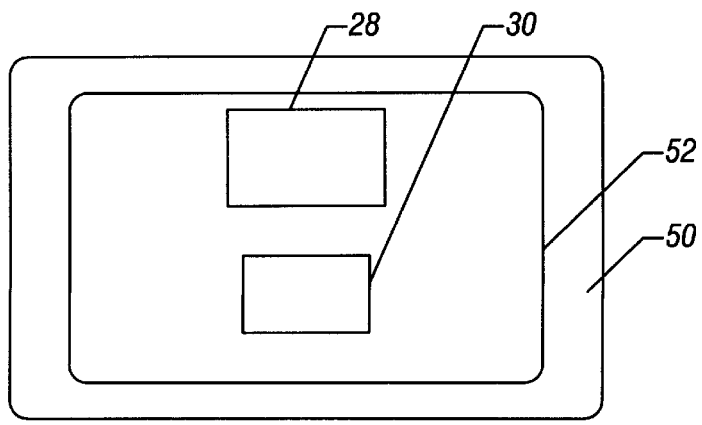
FIG. 10 is a top plan view of a larger and a smaller die in position on a wafer tape.

In accordance with still another embodiment, a larger die 28 may be located onto the wafer tape 48 as indicated in block 54 in FIG. 9. Thereafter, a smaller die 30 may be attached next to the larger die 28 on the wafer tape 48 as indicated in block 56. Thus, referring to FIG. 10, the larger die 28 may be positioned next to the smaller die 30 on the adhesive bearing side of the wafer tape 48.

Figure 11:
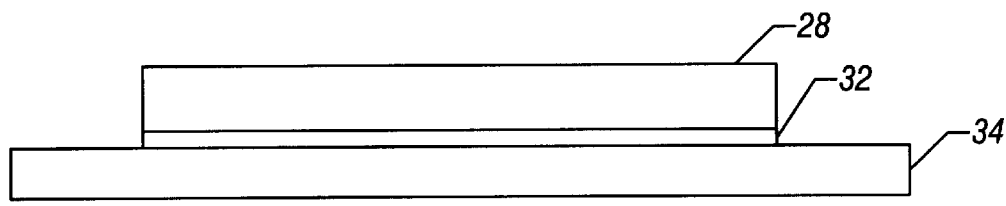
FIG. 11 is an enlarged, cross-sectional view showing a larger die that has been die attached to a support structure.

The larger die 28 then may be stacked on a support structure, as indicated in block 58 in FIG. 9, using a die attach machine. The resulting composite is shown in FIG. 11. The larger die 28 is mounted on a die attach 32 over the support structure 34.

Next the smaller die 30 is mounted onto the larger die 28 (block 60 in FIG. 9). This may be done using the die attach machine. The composite of the die attach materials, the larger and smaller dice 28 and 30 and the support structure 34 is then secured together in a die attach machine. The composite, shown in FIG. 12 includes die attach layers 32 between the dice 28 and 30 and the support structure 34. The composite is then packaged as indicated in block 62 in FIG. 9.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method of assembling multi-chip modules comprising:
   using a die attach machine to attach a first, relatively larger die to a support structure; and
   affixing a second, relatively smaller die to a larger die without using a die attach machine.

2. The method of claim 1 wherein using a die attach machine occurs before affixing a smaller die to a larger die.

3. The method of claim 1 wherein affixing a smaller die occurs before using a die attach machine to attach a larger die to a support structure.

4. The method of claim 1 wherein said smaller die is mounted on said larger die using a pick and place machine.

5. The method of claim 1 wherein said smaller die is mounted on said larger die when said larger die is still part of a wafer.

6. The method of claim 1 including attaching a larger die to a wafer tape and then mounting the smaller die on a larger die.

7. The method of claim 6 including mounting the smaller die to larger die still on the wafer tape.

8. The method of claim 7 including positioning the smaller die and the larger die next to one another on the wafer tape.

9. The method of claim 8 including attaching a larger die to a support structure and then attaching the smaller die to the larger die.

10. The method of claim 9 including using a pick and place machine to pick up the larger die and attach it to a support structure and to pick up the smaller die and attach it on top of the larger die.

11. A method of assembling multi-chip modules comprising:
    locating a first, relatively larger die on a wafer tape;
    attaching a second, relatively smaller die to a larger die; and
    die attaching the attached dice to a support structure.

12. The method of claim 11 including using a pick and place machine to mount said smaller die on said larger die.

13. The method of claim 11 including adhesively securing said larger die to said wafer tape.

14. A method of assembling multi-chip modules comprising:
    locating a larger die on a wafer tape;
    attaching a smaller die next to a larger die on said wafer tape;
    mounting a larger die to a support structure;
    mounting said smaller die on said larger die; and
    securing said smaller die and said larger die on said support structure.

15. The method of claim 14 including using a pick and place machine to locate said larger die on said wafer tape.

16. The method of claim 15 including adhesively securing said larger and smaller dice to said wafer tape.

17. The method of claim 16 including locating a die attach material between said larger and smaller dice.

18. The method of claim 17 including locating a die attach material between said larger die and said support structure.

19. The method of claim 18 including curing said die attach material between said dice and between said support structure and said larger die at one time in a die attach machine.

* * * * *